US007646625B2

(12) United States Patent
Philipp et al.

(10) Patent No.: US 7,646,625 B2
(45) Date of Patent: Jan. 12, 2010

(54) CONDITIONING OPERATIONS FOR MEMORY CELLS

(75) Inventors: Jan Boris Philipp, Peekskill, NY (US); Thomas Happ, Tarrytown, NY (US); Thomas Nirschl, Essex Junction, VT (US)

(73) Assignee: Qimonda AG, Munich (DE)

(*) Notice: Subject to any disclaimer, the term of this patent is extended or adjusted under 35 U.S.C. 154(b) by 61 days.

(21) Appl. No.: 11/778,786

(22) Filed: Jul. 17, 2007

(65) Prior Publication Data

US 2009/0003035 A1  Jan. 1, 2009

Related U.S. Application Data

(60) Provisional application No. 60/947,328, filed on Jun. 29, 2007.

(51) Int. Cl.
*G11C 11/00* (2006.01)
(52) U.S. Cl. .................. 365/148; 365/199; 365/230.03; 365/189.04
(58) Field of Classification Search .................. 365/148, 365/199, 230.03, 189.04
See application file for complete search history.

(56) References Cited

U.S. PATENT DOCUMENTS 6,396,742 B1 * 5/2002 Korsh et al. ............. 365/185.22

| | | | |
|---|---|---|---|
| 2002/0167838 A1 * | 11/2002 | Perner | 365/173 |
| 2003/0074152 A1 * | 4/2003 | Kessenich et al. | 702/117 |
| 2005/0128855 A1 * | 6/2005 | Joshi et al. | 365/230.06 |
| 2007/0034908 A1 * | 2/2007 | Cho et al. | 257/260 |

OTHER PUBLICATIONS

"Characteristics of OUM Phase Change Materials and Devices for High Density Nonvolatile Commodity and Embedded Memory Applications", Tyler A. Lowrey, Stephen J. Hudgens, Wally Czubatyj, Charles H. Dennison, Sergey A. Kostylev and Guy C. Wickes, Mat. Res. Soc. Symp. Proc., vol. 803, 2004, Materials Research Society, pp. 101-112.
"Enhanced Write Performance of a 64Mb Phase-change Random Access Memory", Hyung-Ros Oh, Beak-Jyung Cho, Woo Yeong Cho, Sangbeom Kang, Buyng-Gil Choi, Hye-Jin Kim, Ki-Sung Kim, Du-Eung Kim, Choong-Keun Kwak, Hyun-Geun Byun, Gi-Tae Jeong, Hong-Sik Jeong and Kinam Kim, ISSCC 2005/Session 2/Non-Volatile Memory/2.3, 2005 IEEE International Solid-State Circuits Conference, Digest of Technical Papers, pp. 48, 49 and 584.

* cited by examiner

*Primary Examiner*—Thong Q Le
(74) *Attorney, Agent, or Firm*—Eschweiler & Associates, LLC

(57) ABSTRACT

One embodiment of the invention relates to a method for conditioning resistive memory cells of a memory array with a number of reliable resistance ranges, where each reliable resistance range corresponds to a different data state. In the method, group of at least one resistive memory cell is accessed, which group includes at least one unreliable cell. At least one pulse is applied to the at least one unreliable cell to shift at least one resistance respectively associated with the at least one unreliable cell to the highest of the reliable resistance ranges. Other methods and systems are also disclosed.

27 Claims, 11 Drawing Sheets

CONDITIONING OPERATIONS FOR MEMORY CELLS

RELATED APPLICATION

This application claims priority to U.S. Provisional Application Ser. No. 60/947,328 filed Jun. 29, 2007, entitled "CONDITIONING OPERATIONS FOR MEMORY CELLS."

FIELD OF INVENTION

The present invention relates generally to semiconductor devices and mere particularly to improved methods and systems for semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

One type of memory device includes an array of resistive memory cells, where individual bits of data can be stored in the individual resistive memory cells of the array. Depending on how the cells of the array are biased, each cell can be put into a more resistive state or a less resistive state. In real world-implementations, the more resistive state can be associated with a logical "1" and the less resistive state can be associated with a logical "0", or vice versa. Therefore, by switching between the resistive states, a user can store any combination of "1"s and "0"s in the array, which could correspond to digitally encoded music, images, software, etc.

Typically, users expect their data to be stored accurately in these memory devices. As such, there is an on-going need to provide memory systems, devices, and methods that can provide accurate data storage in memory.

SUMMARY OF THE INVENTION

One embodiment of the invention relates to a method for conditioning resistive memory cells of a memory array with a number of reliable resistance ranges, where each reliable resistance range corresponds to a different data state. In the method, group of at least one resistive memory cell is accessed, which group includes at least one unreliable cell. At least one pulse is applied to the at least one unreliable cell to shift at least one resistance respectively associated with the at least one unreliable cell to the highest of the reliable resistance ranges. Other methods and systems are also disclosed.

DETAILED DESCRIPTION OF THE INVENTION

Figure 1:
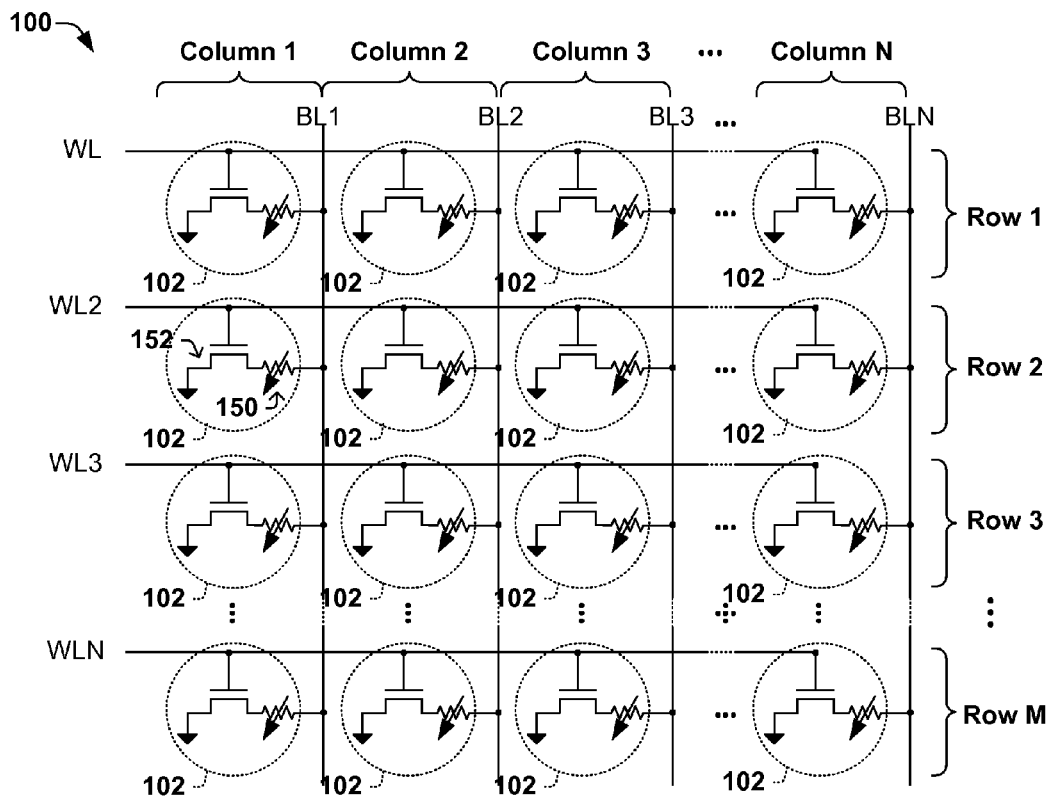
FIG. 1 shows one embodiment of a memory array of resistive memory cells.

One or more Implementations of the present invention will now be described with reference to the attached drawings, wherein like reference numerals are used to refer to like elements throughout. The drawings are not necessarily drawn to scale.

Although several embodiments are illustrated and discussed below in the context of resistive or phase-change memories, aspects of the present invention could also relate to other types of memory devices and methods associated therewith. Some examples of illustrative types of resistive memory include: perovskite memory, binary oxides random access memory (OxRAM), phase change random access memory (PCRAM), and conductive bridging random access memory (CBRAM).

Referring now to FIG. 1, one can see a memory array 100 that includes a number of memory cells 102 that are each capable of storing one or more bits of data, depending on the implementation. The cells 102 are arranged in M rows (e.g., words) and N columns (e.g., bits), indicated as $C_{ROW\text{-}COLUMN}$. Each row of cells is an N bit data word accessible by activation of a wordline WL associated with that row. For example, in the first row of the array 100, the cells $C_{1,1}$ through $C_{1,N}$ form an N bit data word that may be accessible by activation of wordline WL1 via bitlines BL1 through BLN. Generally speaking, while a wordline is asserted, biasing pulses can be applied to the bitlines to program the cells of the corresponding row.

The illustrated array 100 is configured in a single-ended configuration, where a single bitline is coupled to each column of cells. Thus, individual bits of an accessed wordline can be programmed to "1"s and "0"s by applying suitable biasing pulses to the bitlines.

As shown, each memory cell can include a resistive element 150 (e.g., a layer of programmable material), and an access transistor 152. In other non-illustrated embodiments, a diode could be substituted in place of each access transistor 152.

Figure 2:
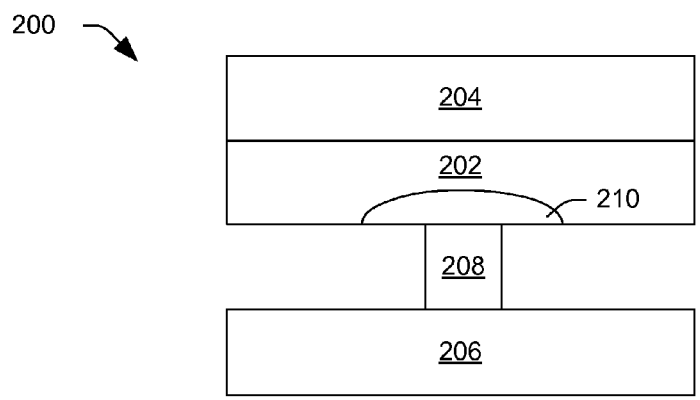
FIG. 2 shows one embodiment of a phase-change memory element.

In one embodiment, the resistive elements 150 could comprise phase change elements, such as the phase change element 200 shown In FIG. 2. The phase change element 200 includes a layer of programmable material 202 (e.g., a polycrystalline chalcogenide material, such as GeSbTe or an AgInSbTe compound, or a chalcogenide-free material, such as GeSb or GaSb) that is positioned between a top electrode 204 and a bottom electrode 206. In the illustrated embodiment, the bottom electrode 206 includes a heater member 208 that can, by means of an appropriate pulse configuration applied to the cell's bitline while the cell is accessed, place a programmable volume 210 of the programmable material in either an amorphous-state (i.e., relatively-high resistance state) or a crystalline state (i.e., relatively-low resistance state). These states could then be assigned to corresponding data states. For example, the amorphous-state could be assigned to a logical "0" and the crystalline-state could he assigned to a logical "1", or vice versa. In various embodiments, additional resistance states could be associated with corresponding data states to implement a multi-bit cell with more than two states per cell.

Figure 3:
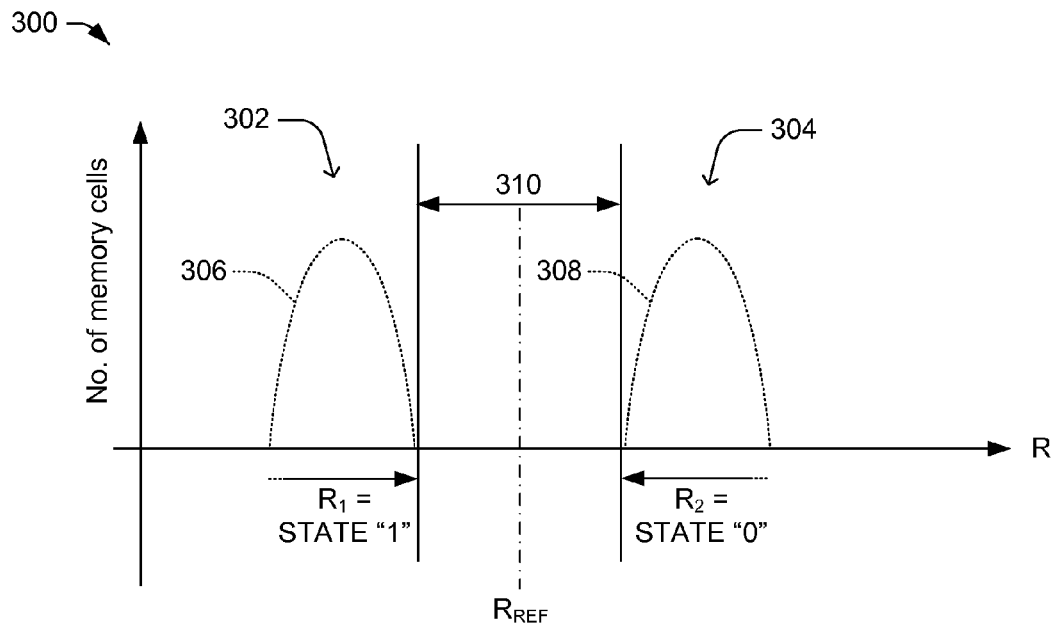
FIG. 3 shows one embodiment of a favorable resistance distribution that relates to an array of binary resistive memory cells.

Because or slight variations between the memory cells of the array, the resistances of the cells can vary across the array. Thus, FIG. 3 shows a favorable resistance distribution 300 for a memory array of binary phase change memory cells, where there are two distinct allowable resistance ranges 302, 304. Each "reliable" cell of the array has a resistance that tends to fail on one of the bell-shaped distributions 306, 308, such that some reliable cells 306 tend to be in a "1" state (i.e., in allowable resistance range 302) while others cells 308 tend to be in a "0" state (i.e., in allowable resistance range 304). Because there is sufficient margin 310 between the two states 302, 304, the sense amp can accurately write to and read from these reliable cells. For example, in one embodiment, a sense amp could read an accessed cell by comparing the cell's resistance to a reference resistance $R_{REF}$ that represents a resistance of a reference memory cell, which is not in a "1" state or a "0" state.

Figure 4:
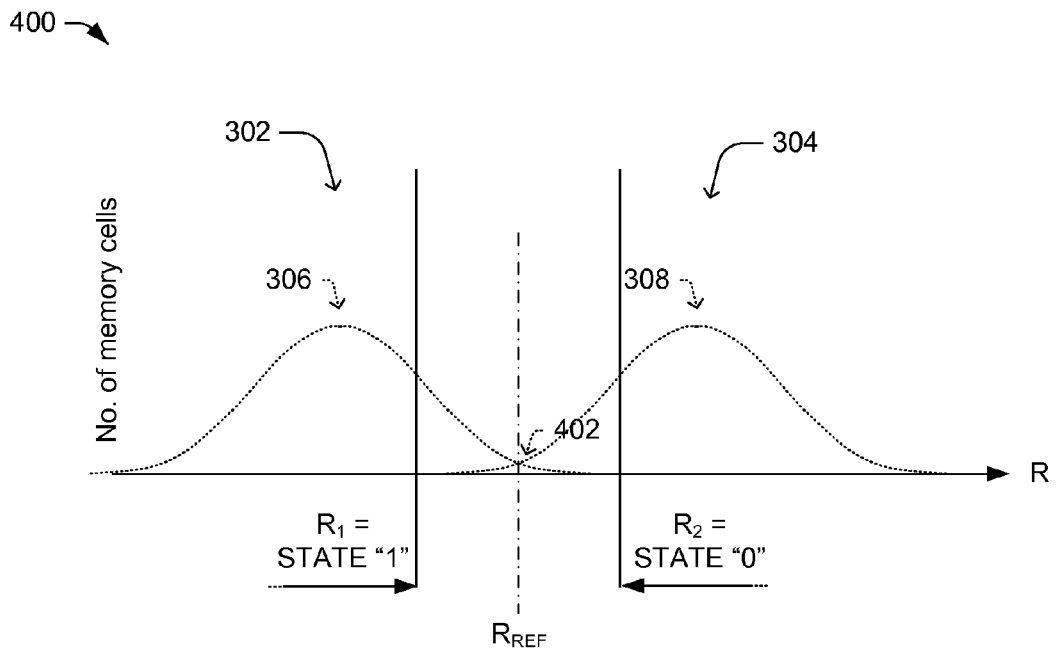
FIG. 4 shows one embodiment of an unfavorable resistance distribution that relates to an array of binary resistive memory cells.

In some cases, however, the array may include unreliable cells in addition to reliable cells, such as shown in FIG. 4. As shown, unreliable cells have resistances 402 that are overlapping or otherwise uncertain.

Unreliable cells can arise in several ways. For example, after the memory array is initially manufactured and before the cells are accessed, the cells are often unreliable. Therefore, before a resistive memory can be shipped to a customer, the memory must be conditioned to ensure that the individual memory cells are within specification (i.e., data can be properly written to and read from the individual cells).

To initially prepare the memory for a customer, aspects of the present invention relate to methods and systems for conditioning unreliable cells to bring their resistances within the allowable resistance ranges. Accordingly, these methods and systems can repair the unreliable cells so correct data may be accurately written to and read from the cells. In one embodiment, the conditioning shifts the initial (unreliable) resistance of all of the cells to the highest resistance range. For example, in FIG. 3, resistance range 308 would be the highest resistance range. In other embodiments, the conditioning could shift the initial resistance to any one predetermined resistance range.

Figure 5:
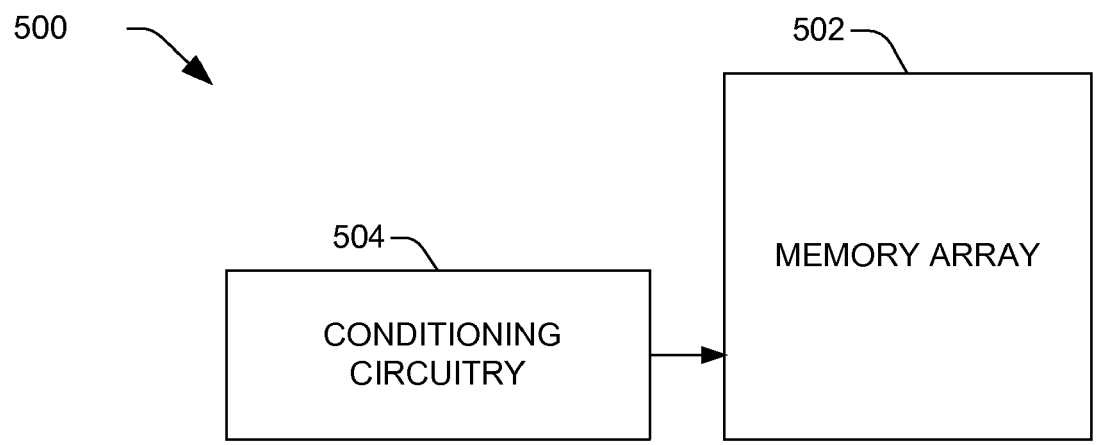
FIG. 5 shows one embodiment of a memory device that is coupled to conditioning circuitry.

Referring now to FIG. 5, one can see a memory device 500 that is configured to condition unreliable cells. The memory device 500 includes a memory array 502 (such as previously discussed array 100) and conditioning circuitry 504. Generally speaking, the conditioning circuitry 504 is configured to apply at least one pulse to at least one bitline associated with any unreliable cells in the memory array 502. This at least one pulse is configured to shift the resistances of the unreliable cells from the unreliable resistance ranges to the reliable resistance ranges, thereby conditioning or repairing the unreliable cells.

Depending on the Implementation, the conditioning circuitry 504 could be either off-chip circuitry (e.g., a production line tester used to condition the memory cells prior to commercial distribution) or on-chip circuitry (e.g., built in self-test (BIST) circuitry that is often formed on the same die as the memory array). In some embodiments, this conditioning circuitry 504 could be used a single time prior to commercial distribution of the memory device.

More detailed functionality of the memory array 502 and conditioning circuitry 504 in various embodiments will be appreciated with reference to the following methods. Several illustrative methods (600, 800, 1200, and 1400) are now set forth below with reference to several flowcharts (FIG. 6, FIG. 8, FIG. 12, and FIG. 14, respectively). Although these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein (e.g., memory device 500 in FIG. 5) as well as in association with other structures not illustrated.

Figure 6:
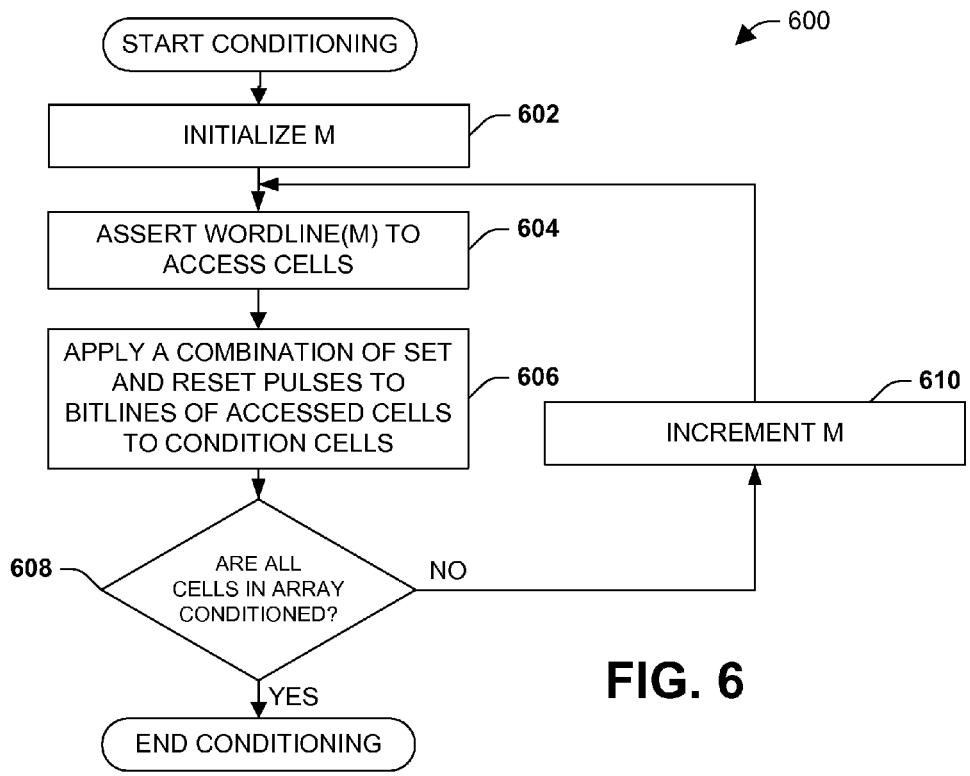
FIG. 6 shows one flowchart of a memory conditioning operation.

Referring now to FIG. 6, one can see method 600 that sequentially accesses one group of cells after another, conditioning each group of cells as it is accessed. In one embodiment, because of its streamlined processing, this method 600 could be used to condition the cells of the memory array prior to commercial distribution.

At block 602, the method starts when an indexing variable M is initialized. For example, M could be set to zero.

At block 604, at least one wordline(M) is asserted to access a group of cells. In various embodiments, one word line or multiple word lines could be asserted at any given time. Thus, wordline(M) could access a single cell (bit), a single row of cells (word), multiple rows of cells (sector, block, etc.), or any other number of cells.

At block 606, a combination of set and reset pulses could be applied to the bitlines associated with the accessed cells to condition the cells. At block 608, the method 600 determines if all cells in the array have been conditioned. If not ("NO" at 608), M is incremented in 610, and blocks 604-608 are repeated until all of the cells in the array are conditioned. After the method has conditioned all of the cells ("YES" at 608), the conditioning may end.

Figure 7:
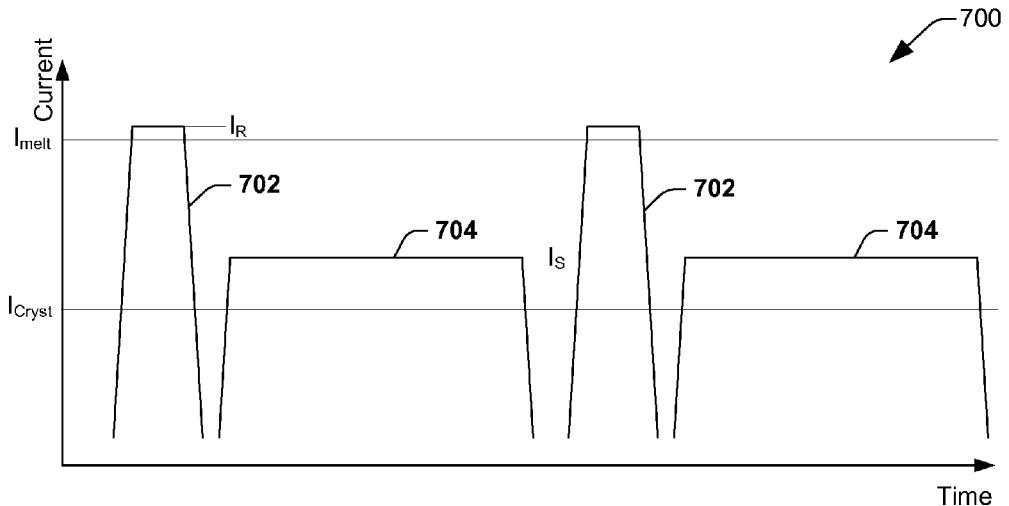
FIG. 7 shows a timing diagram.

FIG. 7 shows a timing diagram 700 that shows of a combination of set and reset pulses that could be applied to the bitlines to condition the cells, in this illustrated embodiment, alternating reset pulses 702 and set pulses 704 are applied. In the context of a phase change memory cell (e.g., cell 200 of FIG. 2), the reset pulses 702 have a current magnitude $I_R$ that is sufficient to heat the programmable volume of the cell above its melting point (which melting point may correspond to approximately $I_{melt}$), while the set pulses 704 have a current magnitude $I_S$ that heats the programmable volume above $I_{Cryst}$, which is the current corresponding to the temperature at which some minimal crystallization may occur. Often these alternating set and reset pulses 702,704 have sufficient current intensify to remove any oxides formed near the top of the heater region under the programmable volume. In addition, the pulses also may change the composition of the programmable volume so proper crystallization may occur. In any event, these pulses may shift the overall resistance of the memory cells from unreliable resistance range to a reliable resistance range, so proper communication with the cell may be achieved.

Figure 8:
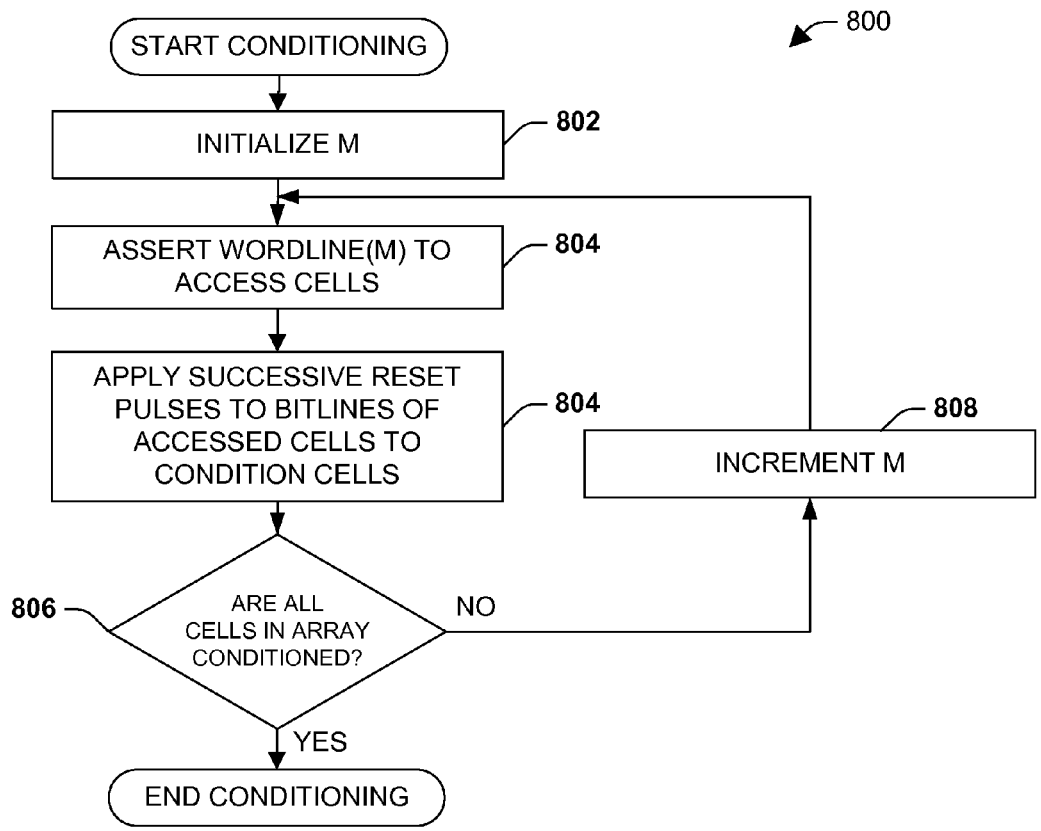
FIG. 8 shows another flowchart of a memory conditioning operation.

Referring now to FIG. 8, one can see another method 800 that uses successive reset pulses to condition the cells of the array. When compared to method 700, method 800 (which may consist essentially of relatively short reset pulses, and not relatively long set pulses) is advantageous in that the array can be conditioned relatively quickly. For purposes of illustration, consider two cases when ten successive pulses are used to condition each group of cells, where a reset pulse has a duration of approximately 10 ns and a set pulse has a duration of approximately 150 ns. In method 700, each group would take at least approximately 800 ns to condition (i.e., 5 set pulses*150 ns+5 reset pulses*10 ns). By contrast, in method 800, each group would take only approximately 100 ns to condition (i.e., 10 reset pulses*10 ns). When this example is extended to an array with a large number of cells, such as a 1 gigabyte (GB) array, one can see that significant time savings can be achieved. For production level conditioning, this will allow a manufacturing facility to process more memory devices with fewer production line testers, thereby reducing fabrication costs.

Figure 9:
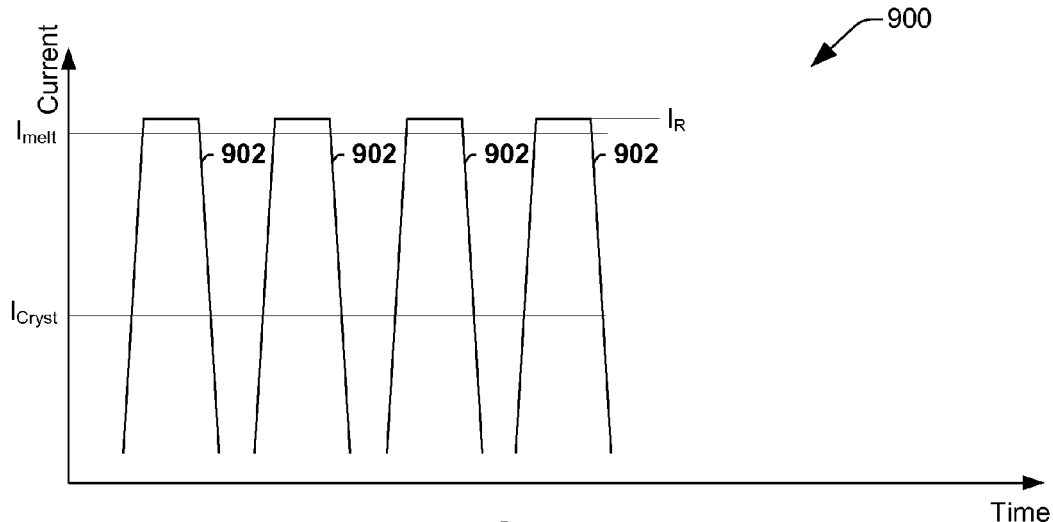
FIG. 9 shows another timing diagram.
Figure 10:
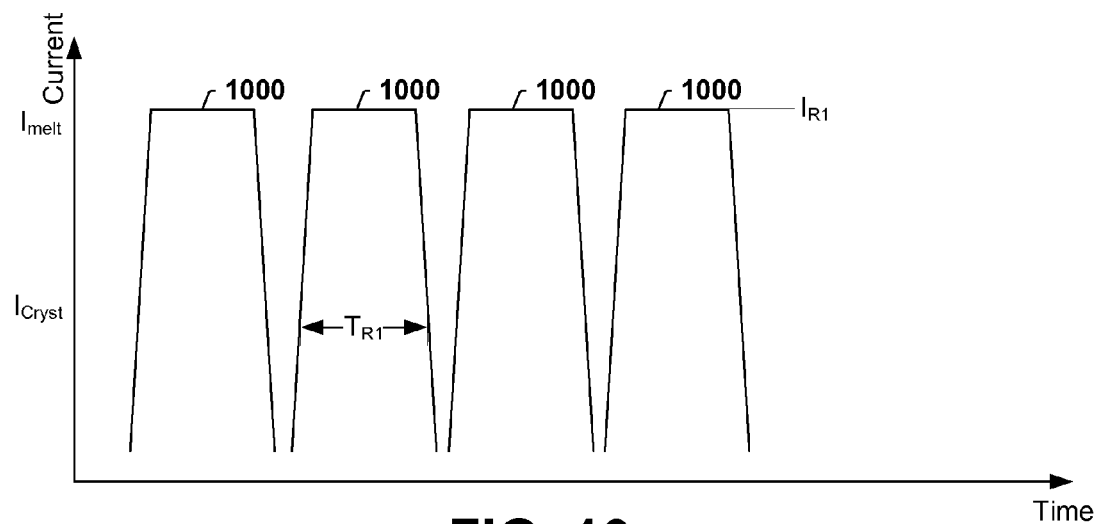
FIG. 10 shows another timing diagram.
Figure 11:
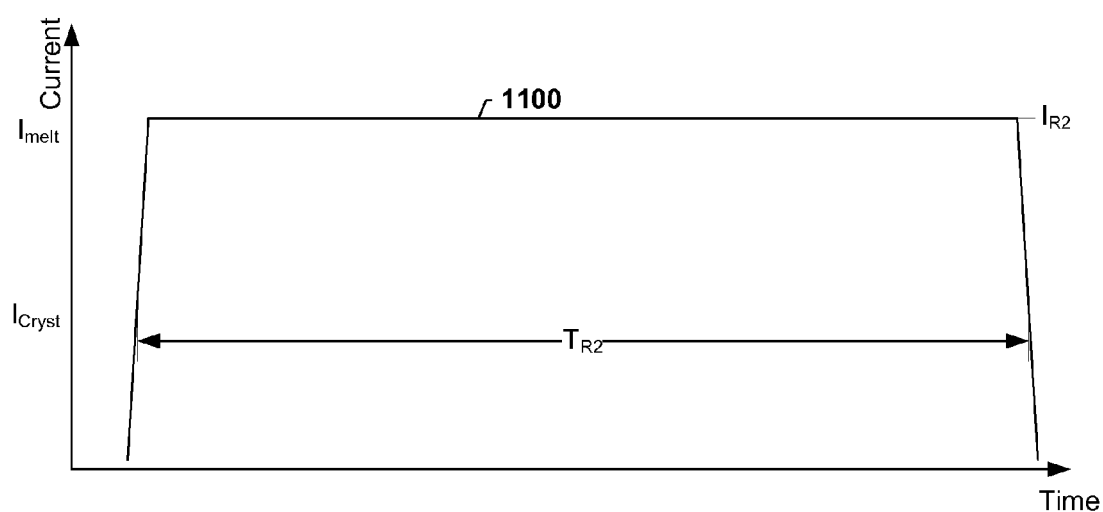
FIG. 11 shows another timing diagram.

FIG. 9 shows an example of one embodiment of a timing diagram 900 illustrating successive reset pulses 902 that could be used to condition the cells. As shown in FIGS. 10-11, the length and number of successive reset pulses could vary depending on the implementation. In FIG. 10, somewhat longer reset pulses 1000 are applied to condition the cells, which could for example have a duration $T_{R1}$ of approximately 100 ns and a current magnitude sufficient to melt the programmable volume of a cell's phase-change element, in FIG. 11, a single reset pulse 1100 is applied to condition the cells, which could, for example, have a duration $T_{R2}$ of approximately 1000 ns and a current magnitude $I_{R2}$ sufficient to melt the programmable volume of a cell's phase-change element.

Figure 12:
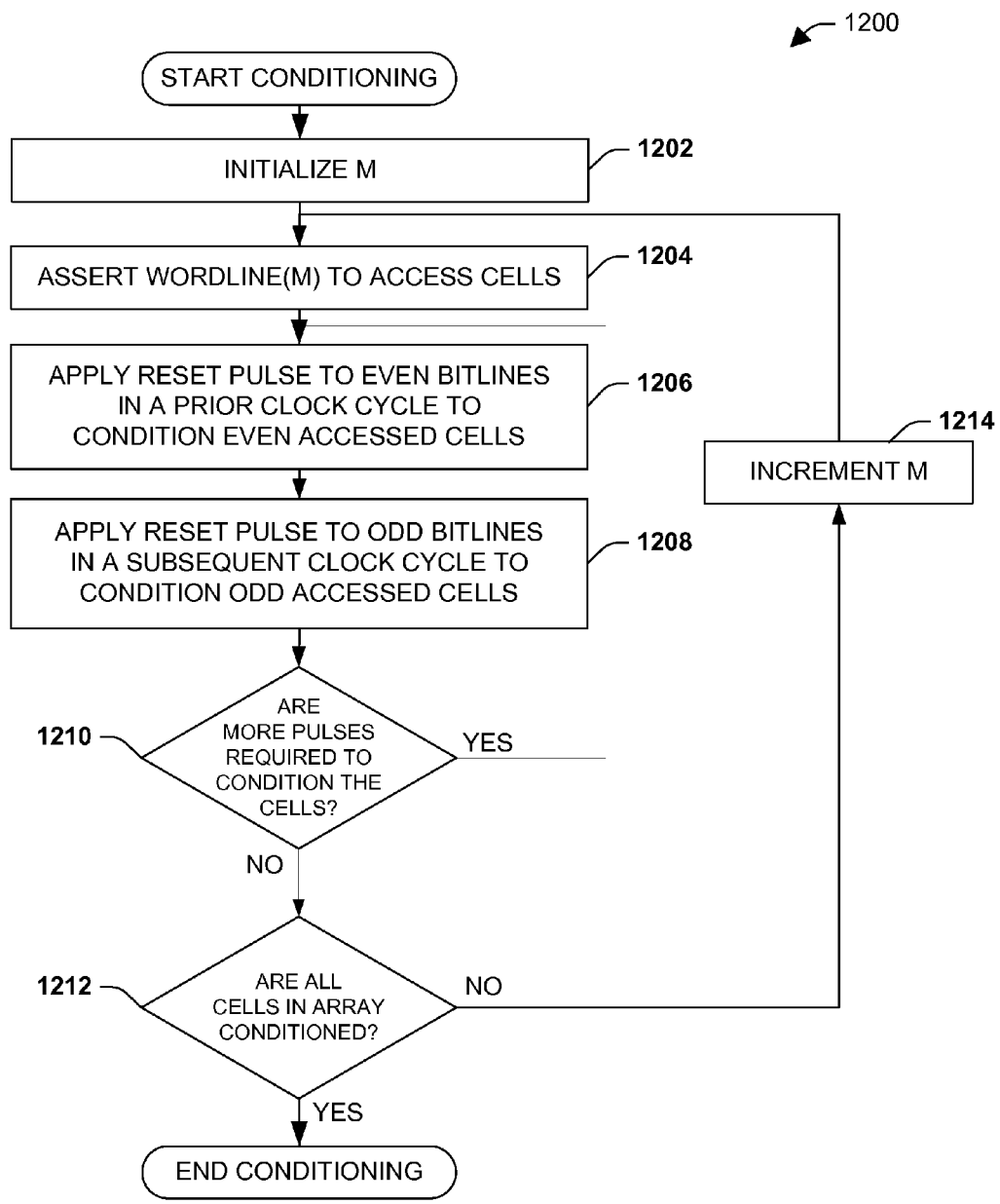
FIG. 12 shows another flowchart of a memory conditioning operation.

Referring now to FIG. 12, one can see still another method 1200 that can be used to condition the memory cells, in this method, reset pulses (or other pulses) are Interlaced between groups of cells. Thus, in block 1206 during a first time period, a reset pulse will be applied to bitlines of cells in even columns. In one embodiment, the reset pulse will not be applied to all bitlines, but rather only to a group of 1, 2, 4. 8, 16 . . . N bitlines. In block 1208, during the next time period, another reset pulse will be applied to the bitlines of cells in odd columns. In block 1210, the method optionally determines whether more conditioning pulses need to be applied to the cell. If more conditioning pulses are needed ("YES" at 1210), blocks 1206-1210 are repeated, if the accessed cells are sufficiently conditioned ("NO" at 1210), the method progresses to block 1212 and determines if all the cells in the array have been conditioned, if not ("NO" at 1212), then M is incremented in 1214 and the appropriate blocks are repeated until all of the cells in the array have been conditioned.

Figure 13A:
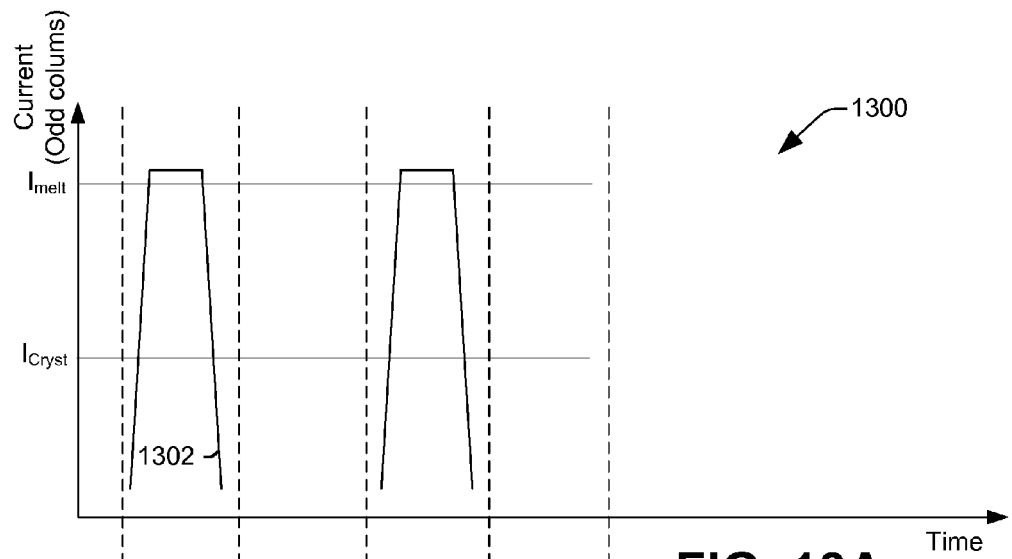
FIG. 13A-13B show additional timing diagrams.
Figure 13B:
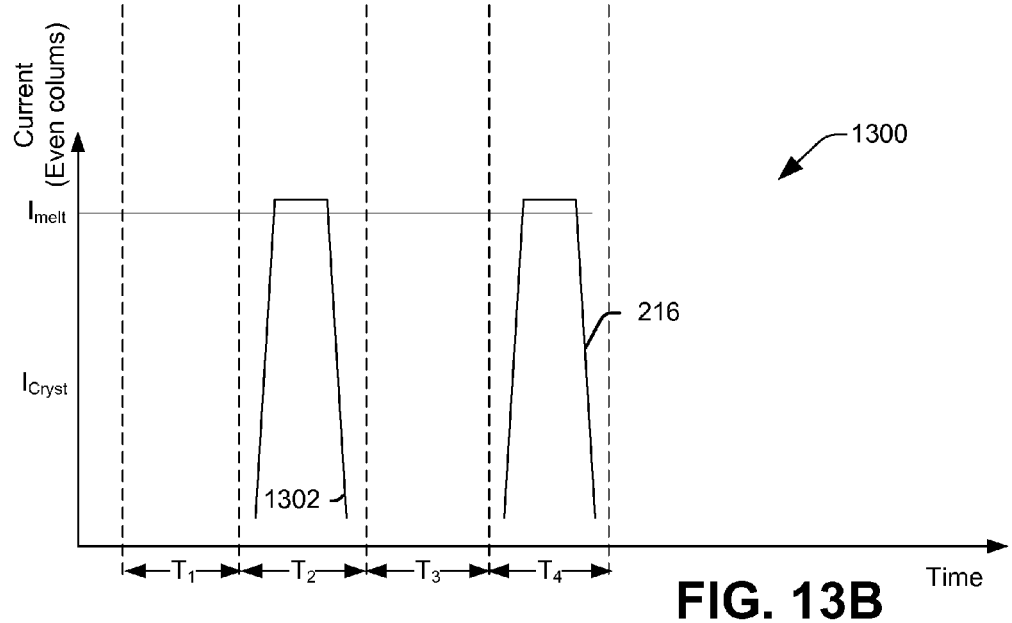

FIGS. 13A-13B show a sample timing diagram 1300 that shows interlaced pulses. In this illustrated embodiment, successive reset pulses are interlaced between even columns and odd columns of cells. Thus, during time period $T_1$, a reset pulse 1302 is applied to the odd columns of cells. During time period $T_2$ a reset pulse 1304 is applied to the even columns of cells. With BIST and other on-chip conditioning circuitry, charge pumps on the chip typically drive the bitlines. Because these charge pumps can only drive a limited amount of current as a practical matter (due to area concerns on the chip), this interlacing provides an effective method of parallelizing conditioning In some instances. Although not illustrated, the interlacing could also be performed between words, pages, blocks, etc.

Figure 14:
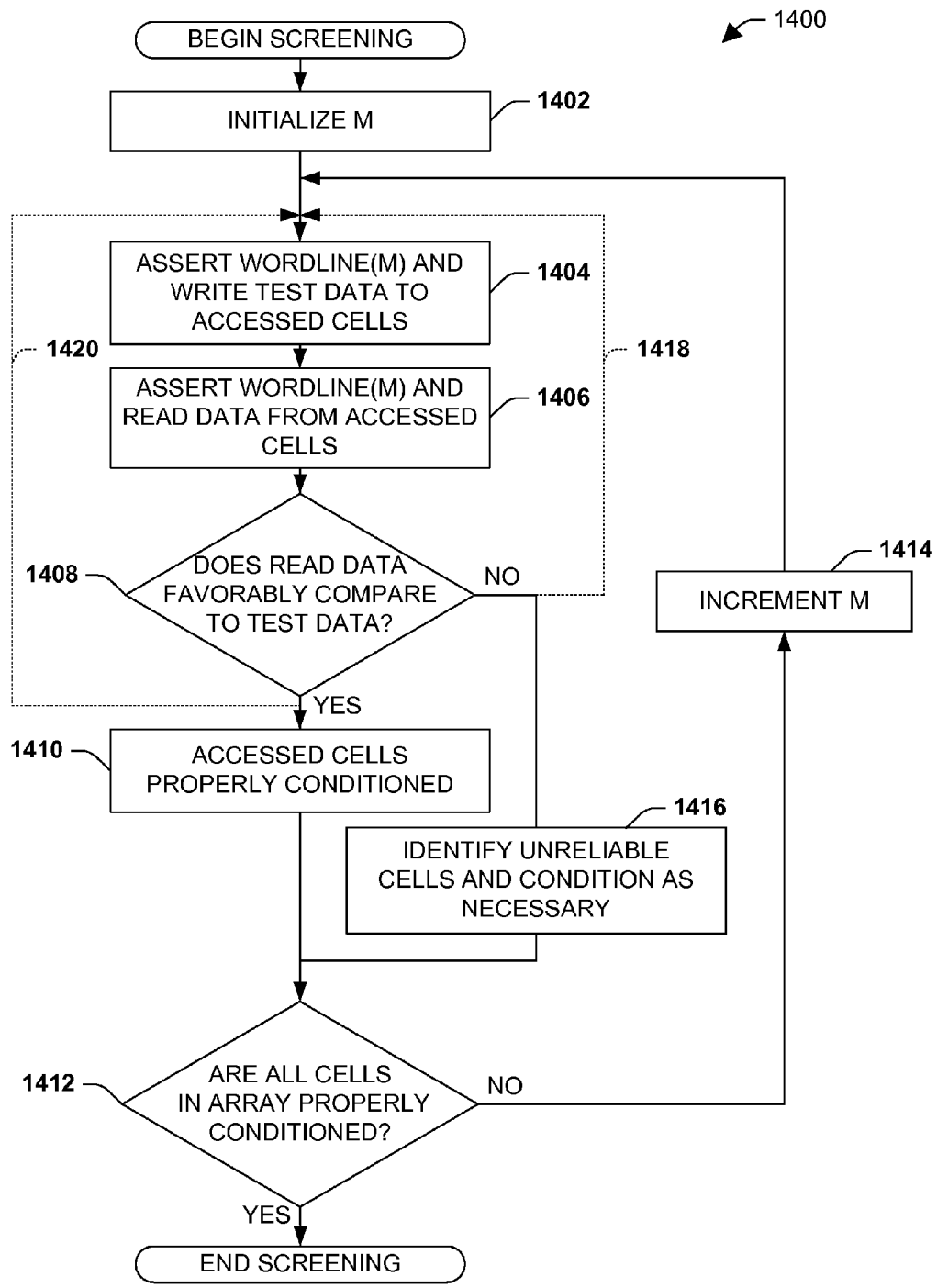
FIG. 14 shows another flowchart of a memory conditioning operation.

Referring to FIG. 14, one can see another method 1400 in accordance with aspect of the invention. In this method, before the cells are conditioned, the cells screened to determine whether they are unreliable. In this embodiment, only unreliable cells then receive conditioning. This method may be quicker and provide greater throughput because fewer cells may need to be conditioned. A more detailed discussion in set forth below.

In block 1402, the indexing variable M is initialized. Again, M could be set to "0", for example.

In block 1404, wordline(M) is asserted to access a group of cells. Test data is written to the accessed cells by applying a suitable pulse on the bitlines associated with the cells.

In block 1406, wordline(M) is asserted to read the data back from the accessed cells.

In block 1408, the method determines if the read data favorable compares to the test data. If the memory cells and accompanying circuitry are working properly (i.e., the cells are reliable cells), the read data should equal the test data. In one embodiment, this comparison could comprise a logical XOR or XNOR function, such that if any read bits differ from corresponding test bits then any errant bits can be uniquely identified. In other embodiments, error-code-checking (ECC), parity bits, or other algorithms could be used.

If the read data does equal the test data ("YES" at 1408), the accessed cells are considered properly conditioned and the method progresses to block 1410. The method then moves to 1412 and determines if other cells should be analyzed.

If the read data does not equal the test data ("NO" in 1408), however, the method may assume that the group includes unreliable cells and may identify precisely which cells are unreliable in block 1416. These unreliable cells may then be conditioned as necessary.

To ensure that the result of block 1408 is accurate, the method may perform optional cycling steps 1418, 1420. This cycling would likely eliminate bad results due to one-time errors such as alpha-particles or other radiation that could alter the bits of the cells.

Figure 15:
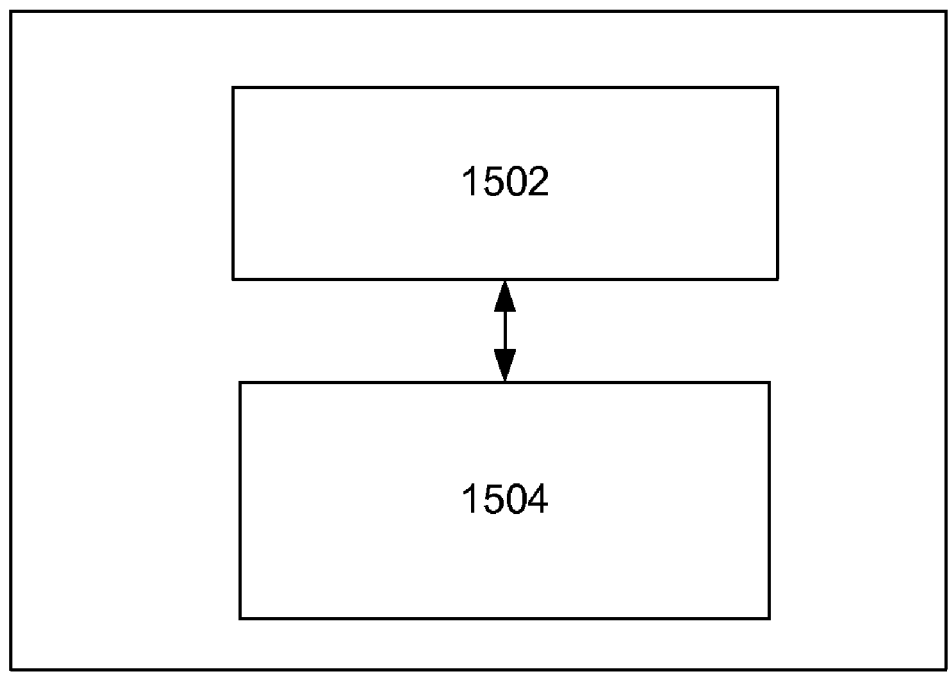
FIG. 15 is a block diagram of a data processing system In which exemplary memory devices may be utilized.

Referring now to FIG. 15, one can see an embodiment of a data processing system 1500 that comprises data processing circuitry 1502 configured to process data; and a memory device 1504 for storing the data. The memory device may be any memory device as described herein. For example, in one embodiment, the memory device 1504 can include an array of phase change memory cells where the processing circuitry could include conditioning circuitry as described herein. In one embodiment the data processing system 1500 could be a communication device, such as a cell phone or pager, for example. In other embodiments, the data processing system 1500 could be a portable electronic product, such as a portable computer, cell phone, pager, camera, music device, voice recorder, etc. In still other embodiments, the data processing system 1500 could comprise an electronic system, such as a car, plane, industrial control system, etc.

Figure 16:
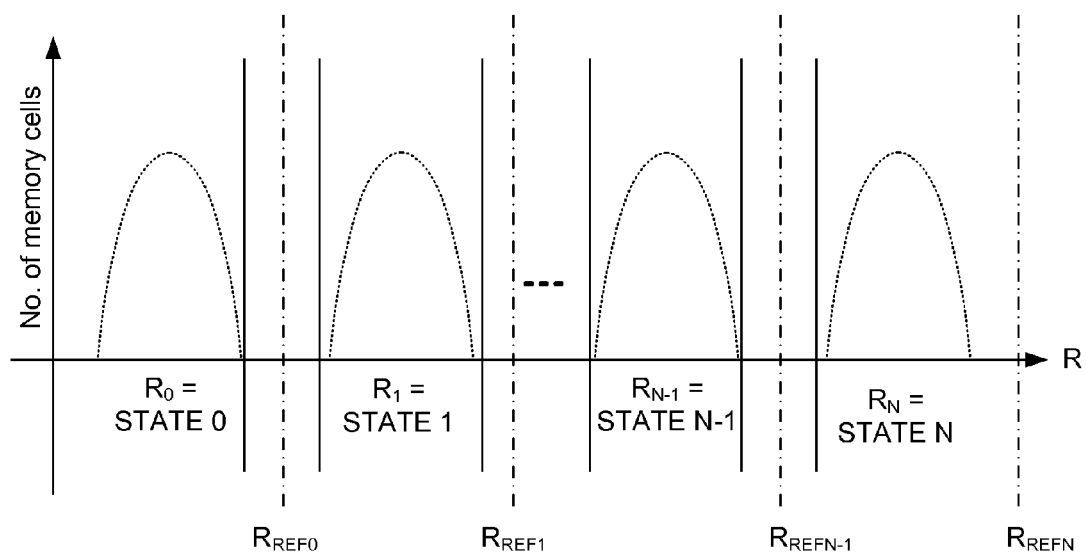
FIG. 16 shows one embodiment of a resistance distribution that relates to an array of multi-bit resistive memory cells.

While one embodiment of a binary phase change memory cell has been discussed for convenience and clarity, aspects of the present invention also relate to multi-bit memory cells (e.g., multi-bit phase change memory cells, multi-bit flash cells, multi-bit resistive cells, etc), such as quad-hit cells or even higher-order-bit cells. FIG. 16 shows a resistance distribution of the multi-bit cell, which again shows one general scheme in which a range of resistances can be divided into a number of allowable resistance ranges. These multi-bit memory cells could also drift to from the favorable distribution, creating unreliable cells as described above.

While the invention has been illustrated and described with respect to one or more implementations, alterations and/or modifications may be made to the illustrated examples without departing from the spirit and scope of the appended claims. For example, although the term "number" may be used, it will be construed broadly to include any positive integer ranging from two to practically infinity, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for conditioning phase-change memory cells of a memory array with a number of reliable resistance ranges, where each reliable resistance range corresponds to a different data state, comprising:
   accessing a group of at least one phase-change memory cell, which group includes at least one unreliable cell;
   applying at least one pulse to the at least one unreliable cell, the at least one pulse configured to shift at least one resistance respectively associated with the at least one unreliable cell to a predetermined one of the number of reliable resistance ranges.

2. The method of claim 1, where the at least one pulse comprises:
   successive pulses having current magnitudes that are approximately equal to one another.

3. The method of claim 2, further comprising: providing circuitry by which a user can write data to the memory array using a combination of reset pulses having a first current magnitude and set pulses having a second current magnitude that differs from the first current magnitude.

4. The method of claim 3, where the current magnitudes of the successive pulses are approximately equal to the first current magnitude of the reset pulses.

5. The method of claim 4, where the successive pulses have an amplitude of at least 90% of maximum access device amplitude and a pulse width of less than 100ns.

6. The method of claim 1, where the at least one pulse has sufficient intensity to remove an oxide layer from a heater member under a programmable volume of the at least one unreliable cell.

7. The method of claim 1, where the at least one pulse has sufficient intensity to change the composition of a programmable region of the at least one unreliable cell.

8. The method of claim 1, where the at least one pulse is interlacedly applied between the one group of cells and another group of at least one cell.

9. The method of claim 1, where the cells of the array comprise chalcogenide phase change memory cells.

10. The method of claim 1, where the at least one pulse comprises a series of several reset pulses.

11. The method of claim 1, where the at least one pulse is a single high-power pulse with a duration that is longer than a duration of a reset pulse used to write data to the memory.

12. A method for conditioning phase-change memory cells of a memory array, comprising:
    accessing a group of at least one of the phase-change memory cells;
    while the group is accessed, applying successive reset pulses to at least one cell within the group to condition the group.

13. The method of claim 12, where the successive reset pulses have an amplitude of at least 90% of maximum access device amplitude and a pulse width of less than 100ns.

14. The method of claim 12, where the successive reset pulses are applied over at least one bitline respectively associated with the at least one cell.

15. The method of claim 12, where conditioning the group comprises:
    shifting at least one resistance respectively associated with the at least one accessed cell to a predetermined resistance range associated with the memory array.

16. The method of claim 12, where conditioning is performed on substantially every cell in the array shortly after processing.

17. The method of claim 12, further comprising:
    analyzing the accessed cells of the group to determine whether the at least one accessed cell has at least one respective resistance that falls within a reliable resistance range or an unreliable resistance range; and
    conditioning any cells that are within the unreliable resistance range, but not conditioning any other cells that are within the reliable resistance range.

18. A memory device, comprising:
    an array of a phase-change memory cells formed on a semiconductor body, the array comprising columns of resistive cells that are coupled to a common bitline and rows of cells are coupled to a common wordline;
    conditioning circuitry configured to condition at least one unreliable cell in the array by accessing the at least one unreliable cell by asserting the wordline and applying at least one pulse to at least one bitline associated with the at least one unreliable cell.

19. The memory device of claim 18, where the conditioning circuitry is further configured to write data to the memory array using a combination of reset pulses having a first current magnitude and set pulses having a second current magnitude that is less than the first current magnitude.

20. The memory device of claim 19, where the at least one pulse comprises successive reset pulses.

21. The memory device of claim 18, where the at least one pulse comprises pulses that are interlaced between groups of cells.

22. The memory device of claim 18, where the memory cells comprise chalcogenide phase change memory cells.

23. A memory device, comprising:
    means for storing data by manipulating a material phase and thus a resistance value of a phase-change material of one or more cells in the memory device;
    means for conditioning at least one unreliable cell in the memory device by applying at least one pulse to at least one bitline associated with the at least one unreliable cell.

24. A data processing system, comprising:
    data processing circuitry; and
    a memory associated with the data processing circuitry; the memory comprising: an array of a phase-change memory cells formed on a semiconductor body;

conditioning circuitry configured to condition at least one unreliable cell in the array by applying successive reset pulses to at least one bitline associated with the at least one unreliable cell.

25. The data processing system of claim 24, where the memory array comprises an array of chalcogenide phase change memory cells.

26. The data processing system of claim 24, where the successive reset pulses are interlaced between groups of cells.

27. The data processing system of claim 24, where the data processing system comprises at least one, if not all, of the following three items: a communication device, a portable electronic product, and an electronic system.

* * * * *